United States Patent
Chadi et al.

Patent Number: 5,379,313
Date of Patent: Jan. 3, 1995

[54] SEMICONDUCTIVE DEVICES UTILIZING MGTE, MGSE, ZNSE, ZNTE AND ALLOYS THEREOF

[75] Inventors: James D. Chadi, Princeton, N.J.; Tohru Zuzuki, Tsukuba, Japan

[73] Assignees: NEC Research Institute, Inc., Princeton, N.J.; NEC Corporation, Tokyo, Japan

[21] Appl. No.: 115,306

[22] Filed: Aug. 31, 1993

[51] Int. Cl.$^6$ .............................. H01S 3/19
[52] U.S. Cl. .......................... 372/45; 372/43
[58] Field of Search .......... 372/45, 43; 257/201, 257/200

[56] References Cited

U.S. PATENT DOCUMENTS

| | | | |
|---|---|---|---|
| 4,955,031 | 9/1990 | Jain | 372/45 |
| 4,992,837 | 2/1991 | Sakai et al. | 372/45 |
| 5,010,376 | 4/1991 | Nishimura et al. | 372/45 |
| 5,045,897 | 9/1991 | Ahlgren | 372/45 |
| 5,081,632 | 1/1992 | Migita et al. | 372/45 |
| 5,250,814 | 10/1993 | Morita | 372/45 |
| 5,278,856 | 1/1994 | Migita et al. | 372/45 |
| 5,299,217 | 3/1994 | Migita et al. | 372/45 |

FOREIGN PATENT DOCUMENTS

| | | | |
|---|---|---|---|
| 5-21892 | 1/1993 | Japan | H01S 3/18 |

*Primary Examiner*—Georgia Y. Epps
*Attorney, Agent, or Firm*—Arthur J. Torsiglieri

[57] ABSTRACT

An injection laser for operation in the yellow to violet portion of optical spectrum utilizes an indium phosphide substrate on which are lattice matched three successive layers each of the form $(MgSe)_x(ZnSeTe)_{1-x}$, where x has a positive value for each layer up to 1 in the first and third layers but in the second layer has a value less than that of either the first or third layer and the first and third layers are doped to be of opposite conductivity type.

9 Claims, 1 Drawing Sheet

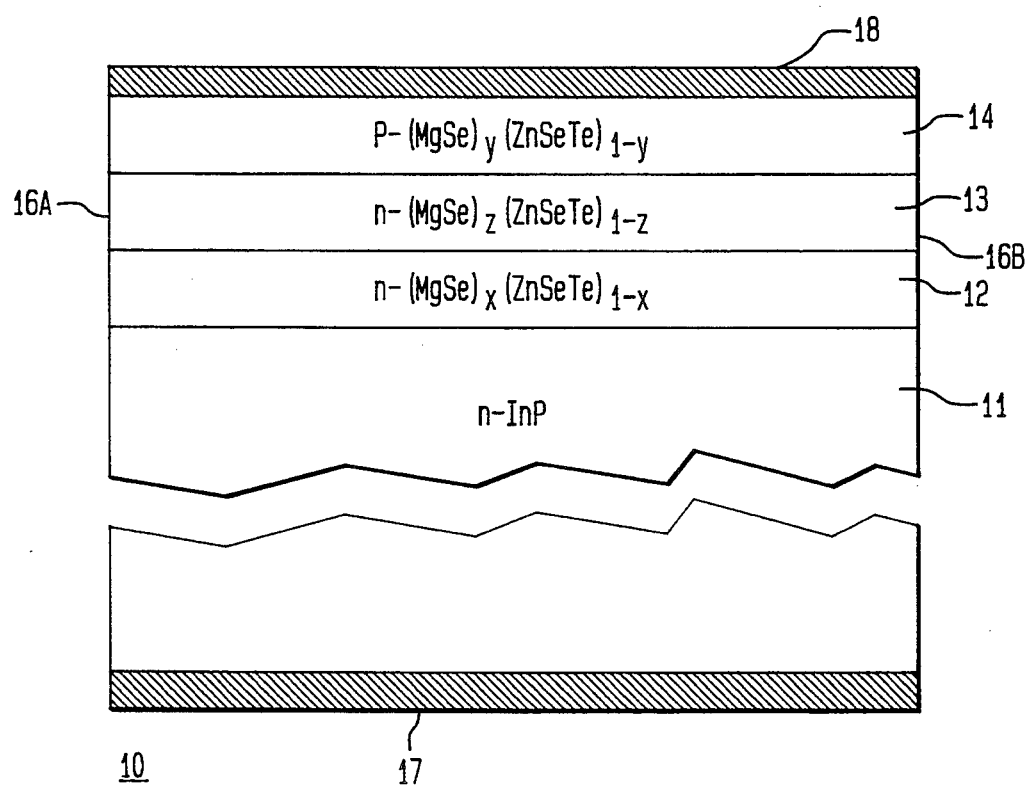

SEMICONDUCTIVE DEVICES UTILIZING MGTE, MGSE, ZNSE, ZNTE AND ALLOYS THEREOF

FIELD OF THE INVENTION

This invention relates to semiconductors devices and more particularly to devices that utilize as active layers one or more of magnesium selenide (MgSe), magnesium telluride (MgTe), zinc selenide (ZnSe), zinc telluride (ZnTe) and alloys or mixtures of such Group II-Group VI compounds.

BACKGROUND OF THE INVENTION

II–VI compounds have recently become of interest as possible materials for use in semiconductive diode injection lasers, particularly for operation in the blue-green portion of the optical spectrum. Such compounds can be prepared to have large band gaps suitable for emitting light in that portion of the spectrum. In particular, ZnSe has been used in the first blue-emitting diode lasers. However, such lasers tend to have low operating lives at room temperatures because of large heating effects.

Accordingly, there remains a need for longer lived lasers in the blue portion of the spectrum. Additionally, there is a need for laser operation at other portions of the wavelength spectrum. In particular, highly useful would be a materials system that could be used to tailor operation to chosen wavelengths over a relatively wide portion of the optical spectrum.

Generally, the operating range of an injection laser is determined by the band gap of the material in the layer of the laser where the injected holes and electrons recombine to emit the laser light. An injection laser generally comprises a multi-layered structure that includes a central layer, which is usually described as the active or recombination region where holes and electrons recombine to emit light and that is relatively free of dopants, and doped layers on opposite sides of the central layer, which are usually described as the cladding layers that serve as the source of the holes and the electrons, respectively, that are injected into the active layer for recombination. Additionally, the cladding layers are generally designed to have characteristic band gaps wider than those of the active region so that they serve as reflecting boundaries to help confine the emitted light within the active region. These cladding layers are also desirably of high conductivity both to keep power losses low and the heating effects small and to serve as good sources of the holes and electrons injected into the active layer.

There are a variety of considerations that go into the choice of the compositions of the various layers. First, the wavelength of the emitting light is determined by the band gap of the material forming the active layer so that the choice of this material is constrained by the output wavelength desired. Further constraints on this material are the need for the active layer to be lattice matched to the cladding layers so that the entire multilayer structure can be essentially monocrystalline with few dislocations or defects, a factor important for efficient operation.

There are various constraints also on the choice of materials for the cladding layers. As mentioned, they need to lattice match the active layer. Additionally, since it is usually necessary to grow the multilayered layer by epitaxial deposition over a suitable monocrystalline substrate the cladding layers need to be of a composition that will lattice match well with readily available substrates. Another constraint already mentioned is that the band gap of each of the materials forming the cladding layers needs to be wider than that of the active layer because of the confining role of the cladding layers. Another important constraint is that one of the cladding layers needs to be doped p-type and the other n-type so that a p-n junction can be formed at the active region. Moreover, if the heating losses in the laser are to be low, a factor important for long life, each of the cladding layers needs to be doped to concentrations high enough to achieve high conductivity, advantageously to concentrations of at least $10^{18}$ doping center per cubic centimeter The doping problem is a common one in II–VI compounds, most of which can be doped relatively easily to be one conductivity type but resist efforts to dope them to the opposite conductivity type. Since most semiconductive devices depend for operation on the presence of two layer of opposite conductivity defining a p-n junction therebetween, II–VI compounds have found limited commercial use hitherto. In particular, because of the difficulties in doping posed by the II–VI compounds that have been studied extensively, there has been little recent activity in studying compounds such as MgSe and MgTe.

SUMMARY OF THE INVENTION

We have examined the problem of doping in II–Vi semiconductors of the group consisting of ZnSe, ZnTe, MgSe and MgTe from a first-principled self-consistent quantum mechanical approach. Based on the experience with ZnTe and ZnSe, these compounds were expected to resist either n-type or p-type doping. As a result of our microscopic studies, we have discovered that the n-type doping of ZnTe and MgTe is hindered by the formation of localized DX-like deep donor centers, but that these types of centers are energetically unfavorable in ZnSe and MgSe, making these latter materials promising for n-type doping by donors, such as aluminum, gallium, indium, bromine and chlorine.

Our studies further indicate that the realization of high p-type conductivity can be significantly improved by alloying ZnTe with ZnSe. Moreover, without MgSe, the ZnSe-ZnTe alloys, particularly alloy compositions near $ZnSe_{0.7}Te_{0.3}$) have excellent both p-type and n-type doping properties but with a band gap lower than that of ZnSe. The addition of MgSe to the ZnSe-ZnTe alloy makes it possible to realize band gaps equal to and larger than that of ZnSe, while maintaining the superior n-type and p-type doping properties of the alloy.

Accordingly such materials are particularly useful as cladding layers where their high conductivity for both n-type and p-type mades feasible injection lasers with low losses and low heating, factors conductive to long life.

Other important considerations are the need for good lattice matching of the recombination layer with the various other layers necessary for operation as an injection layers, such as the layers needed as the source of the injected holes and electrons that are to recombine in the recombination layer. It is important that these various layers be lattice matched to one another and to the substrate so that the multilayer structure be substantially monocrystalline with few defects.

Based on these considerations, as is discussed in more detail later, injection laser embodiments of the invention typically comprise a substrate, such as indium phosphide, on which are formed in turn three layers each of which can be largely of $(MgSe)_x(ZnSe_{1/2}Te_{1/2})_{1-x}$ where x has a positive value of up to one. An important feature of this alloy is that both MgSe and $ZnSe_{1/2}Te_{1/2}$ are very nearly lattice-matched to InP and therefore, the alloy maintains good lattice matching independent of x.

The first and third of these layers serve as the cladding layers and the second the active of recombination layer. One of the two cladding layers includes a high concentration of donors, the other of acceptors, so that the desired p-n junction can be formed therebetween. The values of x in the first and third layers are larger than its value in the second layer so that the band gap in the second layer will be desirably narrower than that in either the first or third layers.

An advantage of the preferred material system is that changes only in the value of x for the active layer can be used to select the operating wavelength over much of the yellow to violet portion of the optical spectrum without necessitating a change in substrate.

Moreover, because the $(MgSe)_x(ZnTeSe)_{1-x}$ system permits cladding layers of high conductivity and so lower resistance, the power losses should be low and operating lifetime long.

For fine tuning of the lattice constants, sulphur may be substituted for a small fraction, no more than a few percent, of the selenium of MgSe and zinc may be similarly substituted for a small fraction of the Mg. Alternatively, the concentration of Se and Te in the $ZnSe_{1/2}Te_{1/2}$ alloy can be varied by a few percent around the value of $\frac{1}{2}$ in addition to or independently of the above.

Additionally, in alternative embodiments CdS can be included for part of all of the active layer composition.

BRIEF DESCRIPTION OF THE DRAWINGS

The invention will be better understood from the following more detailed description taken with the accompanying drawing in which: the single FIGURE shows a semiconductor injection layer in accordance with one embodiment of the invention.

DETAILED DESCRIPTION

Before discussing the specific details of an embodiment of the invention, it will be helpful to discuss some of analytical bases of the invention.

We have done an extensive set of first-principles quantum mechanical calculations to determine the binding energies of various done and acceptor impurities in ZnSe, MgSe, ZnTe and MgTe to determine the thermal stability of desirable effective-mass-states as compared to undesirable deep states. In particular, atomic configurations consisting of impurities on substitutional sties as well as impurities and/or their nearest neighbors in various off-center sites were studied. These calculations indicate that aluminum and gallium done impurities in ZnSe and MgSe are stable when in tetrahedrdrally-coordinated substitutional sties and give rise to shallow effective mass-like donor states whereas these same impurities in ZnTe and MgTe are calculated to move appreciably off-center, leading to a trigonal configuration and giving rise to deep donor states. Similar studies for acceptor nitrogen atoms in MgSe and MgTe indicate N atoms in MgTe will give an effective mass-type of acceptor state and in MgSe have binding energies sufficiently low that they should serve to provide low resistance p-type doping in MgSe.

The FIGURE shows the basic structure of a semiconductor injection laser 10. It includes a substrate 11, which provides the basic structural support for the laser. The substrate typically comprises a substantially monocrystalline wafer whose lattice parameters are well suited for growing thereover the various functional layers needed for base operation in a manner to maintain a high degree of monocrystallinity free of dislocations or defects for the entire crystalline structure. As is mentioned earlier, such crystallinity is important to efficient laser operation. In a preferred embodiment, the substrate is heavily doped n-type indium phosphide.

Overlying the substrate 11 and lattice matched to it is the layer 12 that serves both as a confining layer and as a source of electrons to the recombinating layer. In accordance with an illustrative embodiment of the invention, this layer is of $(MgSe)_x(ZnSeTe)_{1-x}$, where x has a positive value up to 1, and is doped with a suitable donor, such as aluminum, gallium, chlorine, indium or bromine, of which aluminum and chlorine are presently preferred. It is characteristic of this alloy that each component, the MgSe and the ZnSeTe, has lattice constants well matched to the indium phosphide substrate, so that the lattice matching is largely independent of the value of x. In particular in the ZnSeTe alloy, the ZnSe component has a lattice constant smaller than that of indium phosphide, while the ZnTe component has a lattice constant larger than that of indium phosphide. The alloy $(ZnSe)_{0.5}(ZnTe)_{0.5}$ has a lattice constant very well matched to that of the indium phosphide. Moreover, the fraction of the ZnSe in this alloy can be varied between 0.3 and 0.7 without too serious effect on the lattice constant, and even more widely, if other compensating atoms are included to aid the lattice matching. ZnSeTe should accordingly be understood to include this wider range.

Overlying layer 12 and lattice matched to it is the recombining layer 13. This layer advantageously is at most only lightly doped compared to layer 12, typically also n-type, and needs to be of a material having a band gap narrower than that of either layer 12 or of layer 14 that will be deposited over it. The inclusion of little, if any, added doping in layer 13 helps keep the defects in this layer especially few, which is of particular importance for high efficiency.

This layer 13 preferably is of $(MgSe)_x(ZnSeTe)_{1-z}$ with the z chose to provide the desired band gap. In particular, z needs to be less than x of layer 12, if layer 13 is to have a band gap narrower than that of layer 12, so that layer 13 can serve as a confining layer. The band gap of layer 13 will determined the wavelength of the stimulated emission. Alternatively, the recombining layer 13 can be of other semiconductors that can be lattice matched to layer 12 and have a narrower band gap. Cadmium sulfide (CdS) and alloys of cadmium sulfide with $(MgSe)_z(ZnSeTe)_{1-z}$ are examples of such semiconductors and their use could enlarge the portion of the optical spectrum at which laser emission would be obtainable.

Layer 14 overlies layer 13 and is lattice matched to it. Preferably, it is largely of $(MgSe)_y(ZnSeTe)_{1-y}$ where y is a positive value up to 1. In particular, y is chosen to provide a band gap for layer 14 wider than that of recombining layer 13 so that it will serve as a confining layer. Layer 14 is doped to be p-typed with acceptor impurities, such as nitrogen, phosphorus, arsenic, or lithium, of which nitrogen is presently preferred, but it otherwise can be the same composition as layer 12.

It is generally desirable for efficient injection that the bottom of the conduction band of layer 12 be at least several time kT higher than the bottom of the conduction band of layer 13 where k if Boltzman's constant and the T is the absolute temperatures and that the top of the valence band of layer 14 be at least several times kT lower than the top of the valence band of layer 13.

As mentioned earlier it is a particular advantage of the preferred combination of materials described that it will provide a well-matched structure largely independent of the values of x,y and z.

Additionally, if the laser is to be operated as an edge emitting layer, it is usually desirable to have the opposite edges of the recombining layer 13 be highly reflective of the emitted radiation, although at least one of the two edges 16A, 16B should be partially transmissive for the laser light to exit.

It is also important to provide electrical contacts 17, 18 to substrate 11 and outer layer 14, respectively, to provide the current flow through the structure needed to support the base emission. In this regard to achieve high current densities with low operating voltages, it is desirable that the donor and acceptor dopings of layers 12 and 14 be as high as is practicable, typically at least to $10^{18}$ per cubic centimeter and preferably of the order of $10^{19}$ per cubic centimeter or higher.

The dimensions of the various layers are chosen in accordance with known laser design principles.

It may sometimes be preferable to use a substrate other than one of indium phosphide. The particular compositions that have been described for the cladding and active layers can be used with any ordered monocrystalline substrate having a zinc-blend crystal structure with lattice constants between 5.90 Angstroms and 5.85 Angstroms. Other materials meeting these requirements include gallium-indium arsenide alloys.

Moreover, it is feasible to fine tune the lattice constant of the various layers described for better lattice matching to a chosen substrate by substituting a small amount of sulphur for selenium and/or some zinc for magnesium, and/or some selenium for tellurium. Various other substitutions of this kind should be within the skill of the worker in the art. To avoid making the claims unnecessarily complex, it is to be understood that such substitutions are intended to be included in the affected compositions although not recited in the claims.

A variety of known techniques are available for the production of structures of the kind described. Typically they use molecular beam epitaxy (MCB) to grow the desired layers epitaxillay on the chosen substrate. Alternatively chemical vapor deposition (CVD) processes can be used to grow the desired layers.

It should be appreciated that the doped II–VI semiconductors described as the feature of the invention may find application in forms of devices other than injection lasers, such as other devices that can use such materials, such as light emitting diodes or photodetectors.

In particular, the invention should find application in other devices where there is a need for a semiconductor with a wide energy band gap that is to be doped to high conductivity in both n-type and p-type to keep power losses low. One possible such device is high power rectifiers.

We claim:

1. A semiconductive device comprising a monocrystalline multilayer structure that comprises an ordered substrate of zinc blende crystal structure having a specific lattice constant within the range of 5.90 Angstroms and 5.85 Angstroms a first semiconductive layer overlying said substrate and lattice matched thereto comprising $(MgSe)_{x_1}[(ZnSeTi)]_{1-x_1}$, where $x_1$ has positive values less than one, and a dopant for making the layer semiconducting of one conductivity type, a second semiconductive layer overlying said first layer and lattice matched thereto comprising A,B or an AB alloy were A is $(MgSe)_{x_2}[(ZnSeTe)]_{1-x_2}$ where $x_2$ has positive values less than one, and B is CdS, and a third layer overlying said second layer and lattice matched thereto comprising $(MgSe)_{x_3}[(ZnSeTe)]_{1-z_3}$, where $x_3$ has positive values less than one, and a dopant for making the layer of the conductivity type opposite that of the first layer, further characterized in that the band gap of the second layer is narrower than the band gap of each of the first and third layers, and all the layers are lattice matched to the substrate.

2. The semiconductive device of claim 1 in which the dopant in the first layer is chosen from the group consisting of aluminum, gallium, indium, chlorine and bromine, and the dopant in the third layer is chosen from the group consisting of nitrogen, arsenic, phosphorus, and lithium.

3. The semiconductive device of claim 1 in which the substrate is essentially of indium phosphide.

4. The semiconductive device of claim 2 in which the substrate is essentially of indium phosphide.

5. An injection laser comprising a semiconductive device in accordance with claim 4 and separate electrode means connected to the substrate and to the third layer for passing current through the device for the stimulated emission of radiation in the yellow to violet portion of the optical spectrum.

6. A semiconductive device according to claim 3 in which the indium phosphide is n-type, the first layer includes a donor from the group consisting of aluminum, gallium, indium, bromine and chlorine and is n-type, and the third layer includes an acceptor taken from the group consisting of nitrogen, phosphorus, arsenic and lithium and the substrate and third layer are provided with electrical contacts whereby by the passage of current flow through the device injection laser operation may be achieved.

7. A semiconductive device according to claim 3 in which the indium phosphide is p-type, the first layer includes an acceptor from the group consisting essentially of nitrogen, phosphorus, arsenic, lithium and the third layer includes a donor from the group consisting essentially of aluminum, gallium, indium, bromine and chlorine, and the substrate and the third layer are provided with electrical contacts whereby the passage of electron current through the device injection laser operation may be achieved.

8. A semiconductive device in accordance with claim 1 in which the ZnSeTe is $ZnSe_{0.5}Te_{0.5}$.

9. An injection laser in accordance with claim 5 in which the ZnSeTe is $ZnSe_{0.5}Te_{0.5}$.

* * * * *

UNITED STATES PATENT AND TRADEMARK OFFICE
CERTIFICATE OF CORRECTION

PATENT NO. : 5,379,313
DATED : January 3, 1995
INVENTOR(S) : James D. Chadi and Tohru Suzuki It is certified that error appears in the above-indentified patent and that said Letters Patent is hereby corrected as shown below:

On the title page, item [54], change "Zuzuki" to --Suzuki--.

Signed and Sealed this

Twenty-first Day of March, 1995

Attest:

BRUCE LEHMAN

*Attesting Officer*   *Commissioner of Patents and Trademarks*